United States Patent [19]

Hutchins

[11] Patent Number: 4,800,332

[45] Date of Patent: Jan. 24, 1989

[54] RECONFIGURABLE INTEGRATED CIRCUIT WITH ENHANCED TESTABILITY OF MEMORY CELL LEAKAGE

[75] Inventor: Charles L. Hutchins, Sugar Land, Tex.

[73] Assignee: Texas Instruments Incorporated, Dallas, Tex.

[21] Appl. No.: 938,213

[22] Filed: Dec. 5, 1986

Related U.S. Application Data

[63] Continuation-in-part of Ser. No. 709,266, Mar. 7, 1985.

[51] Int. Cl.[4] .................. G01R 31/28; G11C 7/00
[52] U.S. Cl. .................. 324/73 R; 365/201; 371/21
[58] Field of Search ............ 324/73 R, 73 PC, 158 R, 324/118; 371/21, 15, 25; 365/201

[56] References Cited

U.S. PATENT DOCUMENTS 3,242,428 3/1966 Brumley et al. .................. 324/118
4,494,066 1/1985 Goel et al. .................. 324/73 R Primary Examiner—Ernest F. Karlsen
Attorney, Agent, or Firm—Rodney M. Anderson; Theodore D. Lindgren

[57] ABSTRACT

A memory device is described which has the capability for testing portions of its circuitry with a variable test voltage, while allowing the remainder of the circuit to not be affected by variations in the test voltage. A specific example of a test utilizing this feature is a test directed to the leakage of stored charge in a dynamic memory cell through its access transistors controlled by the row lines. A circuit is disclosed which connects a test voltage terminal through a first fuse to the node to which the row decoder biases the unselected row lines. A second fuse and associated circuitry decouples the normal reference supply from this particular node, but does not affect the presence of the reference supply elsewhere in the memory device. The voltage of the test voltage terminal may be modulated to determine the voltage at which the access transistors in the array cause stored charge to leak during a memory cycle which selects another row in the array. After testing is completed, the fuses may be opened by way of a laser beam, thereby connecting the reference supply to the node for biasing unselected row lines, for normal operation.

3 Claims, 2 Drawing Sheets

RECONFIGURABLE INTEGRATED CIRCUIT WITH ENHANCED TESTABILITY OF MEMORY CELL LEAKAGE

This application is a continuation-in-part of application Ser. No. 709,266, filed Mar. 7, 1985 and assigned to Texas Instruments, Inc.

TECHNICAL FIELD OF THE INVENTION

The present invention pertains in general to testing of integrated circuits and, more particularly, pertains to a disconnectable circuit for testing cell leakage in a semiconductor memory device.

BACKGROUND OF THE INVENTION

As the demands of technology have increased, both the density and the multiplicity of functions performed by a given integrated circuit have increased. In addition, the speed at which data is processed through these integrated circuits has also increased. These devices are generally referred to as a large scale integrated circuits (VLSI). To reliably realize VLI devices, new techniques have been developed to both fabricate the device at the semiconductor chip level and also to package the chip. There are some inherent disadvantages to this increased density and speed since the VLSI devices must still be interfaced with peripheral circuits and thus must have some output ports, control port, etc. Due to the large number of functions that are performed by a given VLSI chip, the number of interface connections or IC pins is relatively low as compared to the number of functions that the device performs. The result is that the internal functions are relatively inaccessible for trouble shooting and/or failure analysis, since use of interface connections must be optimized and they are generally dedicated to a functional mode of the device rather than testing modes.

Once a circuit is manufactured utilizing VLSI circuits, it is necessary to test the circuits prior to packaging thereof. This test normally consists of probing the device at the input and output pads and various test points thereon. Failures can then be determined and only acceptable devices packaged. However, in certain circuits, redundant circuit elements are provided that can be inserted in place of faulty elements. One type of circuit that this is utilized in is a semiconductor memory array wherein a redundant column is provided. When one column is determined to be defective, it is deactivated and the redundant column activated to provide a replacement therefor. This activation and deactivation is normally effected by opening polysilicon fuses that are fabricated on the integrated circuit. To open these fuses, a special test facility is provided which has a laser mounted adjacent the probing mechanism. This allows for both replacement of the defective device with the redundant circuit and also retesting thereof.

In testing integrated circuits prior to packaging thereof, speed is one important factor to be considered. Since yields can be as low as 10%, a large amount of time is utilized to test the 90% of defective devices, make a decision and reject these devices. It is therefore desirable to minimize the amount of time to perform a given test.

In addition to reducing the testing time, it is also desirable to measure the parameters of individual devices on a circuit. For a device such as a memory array where there are a large number of similar elements such as the memory cells, such factors as leakage, storage time, etc. are of paramount importance. However, the interconnections between the individual elements and interaction thereof inhibits access to the input and the output of these elements. For example, the storage capacitor in a Dynamic Random Access Memory (DRAM) is normally connected between a reference voltage and one side of a transistor. The parameters of this capacitor can only be measured by charging the capacitor through control of the transistor, with this control being the only variable. This control signal is derived from the output of either the column or row decoder and can only be tested within the constraints of the operation of the decoders. Heretofore, no provision has been made for testing the parameters of individual elements in an integrated circuit.

In view of the above disadvantages with testing the various parameters of integrated circuits, there exists a need for improved methods of performing the test by allowing access to the individual elements in the integrated circuit and also decreasing the time required for making these tests.

SUMMARY OF THE INVENTION

The present invention is a fusable circuit for applying an external voltage to the word lines of a semiconductor memory, for measuring the word line voltage at which leakage occurs between memory cells in a non-selected word line and memory cells in the selected word line. A fuse is connected between an external test voltage terminal and the reference node to which the non-selected word lines are biased. A circuit containing a second fuse causes, in its closed state, the reference voltage to be disconnected from the reference node. By opening both fuses after test, the reference voltage is applied to the reference node for normal operation.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
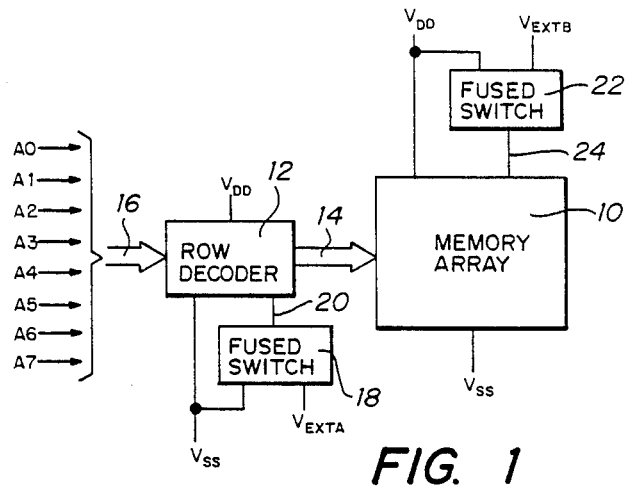
FIG. 1 illustrates a memory array utilizing the reconfiguration testing of the present invention.

Referring now to FIG. 1, there is illustrated a block diagram of a memory device which utilizes the reconfiguration test circuitry of the present invention. This memory is of the type commonly referred to as the MOS Random Access Memory (RAM) devices which are illustrated in U.S. Pat. No. 3,940,747, issued Feb. 24, 1976 to Kuo and Kitagawa, assigned to Texas Instruments Incorporated. The memory includes a memory array 10 which is comprised of a plurality of memory elements arranged in rows and columns. The device can consist, in one embodiment, of 65,536 memory cells which are generally divided into 256 rows and 256 columns. Each cell is a so called one transistor cell of the type illustrated in U.S. Pat. No. 4,081,701, issued Mar. 28, 1978 to White, et al. and assigned to Texas Instruments Incorporated.

A row decoder 12 selects one of 256 mutually exclusive row lines 14 on the memory array 10 in response to receiving an eight bit address A0-A7 on an address bus 16. In normal operation, the row decoder 12 operates at a voltage level of $V_{DD}$ referenced to a voltage of $V_{SS}$. The row lines 14 are alternated between $V_{DD}$ and $V_{SS}$, depending upon the logic state necessary to activate the selected one of the row lines. A fused switch 18 is provided that is connected to the row decoder 12 through a voltage control line 20 and is operable to determine the reference voltage that the row lines 14 are disposed at. The fused switch 18 supplies either $V_{SS}$ to the line 20 or an external voltage $V_{EXTA}$.

In operation, the row line is selected by row decoder 12 by changing the voltage in the row line to the reference voltage on the control line 20. In normal operation of the memory array 10, the reference voltage is disposed at $V_{DD}$ when the row line 14 is selected. When the row line 14 is deselected, the voltage is set to $V_{SS}$. In the test mode, the fused switch 18 is connected such that the external voltage $V_{EXTA}$ can be applied to the line 20 and to the deselected ones of the row lines 14. The voltage $V_{EXTA}$ is input to the memory of FIG. 1 through a test point on the surface of the integrated chip during the testing process. For pass-fail testing the voltage $V_{EXTA}$ can be set at a given voltage level to determine if leakage exists between memory cells of deselected row lines 14 and the selected row line 14. The memory device may also be characterized by incrementally raising $V_{EXTA}$ from $V_{SS}$ to $V_{DD}$ to determine the actual word line voltage at which such leakage occurs to the extent of disturbing stored data. After such tests have been performed, a fuse or series of fuses in the fused switch 18 are opened and $V_{SS}$ is connected to the line 20 and the memory then operates in the normal operating mode. By utilizing the fused switch 18, a portion of the row decoder 12 can have the voltage for a given parameter altered, as will be described hereinbelow.

The memory array 10 also has a fused switch 22 connected thereto through a voltage control line 24. The fused switch 22 is operable to switch between $V_{DD}$ and an external voltage $V_{EXTB}$. In normal operation, the memory array 10 operates at the voltage of $V_{DD}$ with reference to $V_{SS}$. In the test mode, the fused switch 22 is connected to apply $V_{EXTB}$ to the control line 24. After testing has been completed, the fused switch 22 is switched to $V_{DD}$. Both of the fused switches 18 and 22 are initially connected to the respective one of the external voltages $V_{EXTA}$ and $V_{EXTB}$ through external test probes. The switches 18 and 22 are manufactured in this mode. Therefore, it is necessary that the internal fuses of the fused switches 18 and 22 be opened in order to apply the correct voltages. These switches are only utilized during the testing procedure to test various parameters or enhance the testing of the parameters, as will be described hereinbelow.

Figure 2:
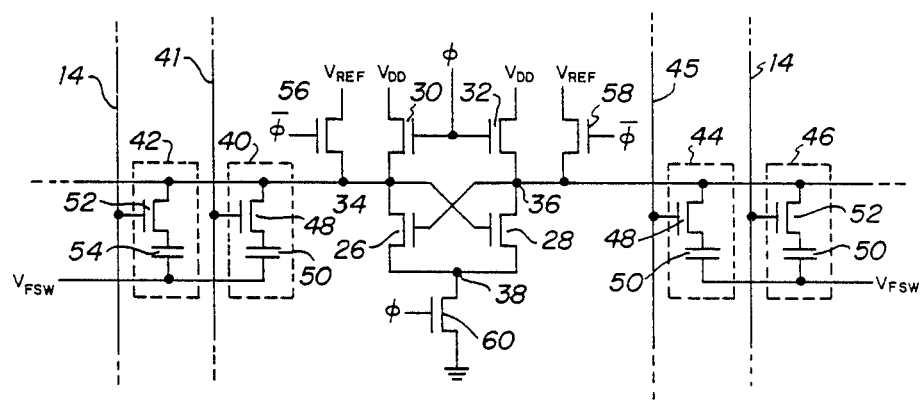
FIG. 2 illustrates a schematic diagram of a sense amp and associated memory cells for the circuit of FIG. 1.

Referring now to FIG. 2, there is illustrated a schematic diagram of a sense amplifier in one of the rows in the memory array 10 with associated memory cells. The sense amplifier consists of a flip-flop or bistable circuit having two cross coupled driver transistors 26 and 28 with associated load transistors 30 and 32. Nodes 34 and 36 represent column lines in the memory array 10 with the node 34 being connected to the drain of the transistor 26 and the gate of the transistor 28 and the gate of the transistor 26 to form a cross coupled arrangement. The sources of transistors 26 and 28 are connected to a common node 38. The load transistors 30 and 32 have the sources thereof connected to the nodes 34 and 36, respectively, and the gates thereof connected to a signal $\phi$. The sources thereof are connected to $V_{DD}$.

The node 34 has a dummy cell 40 connected thereto and controlled by a dummy cell control line 41 and a memory cell 42 controlled by one of the control lines, the memory cell 42 representative of all of the memory cells attached to a select column line in the memory array 10. In a similar manner, node 36 has a dummy cell 44 connected thereto and controlled by a dummy cell control line 45 and a memory cell 46 connected thereto.

Dummy cells 40 and 44 are each comprised of a transistor 48 and a capacitor 50. The gates of transistor 48 are activated by the dummy cell control lines 41 or 45, respectively. Each of the memory cells 42 and 46 is comprised of a transistor 52 and a capacitor 54. Each of the capacitors 50 and 54 have one plate thereof connected to the voltage signal $V_{FSW}$ and the other plate thereof connected to the drain of the respective one of the transistors 48 or 52, respectively. The gates of the transistor 52 are activated by the row control lines 14. Each of these cells is further described in U.S. Pat. No. 3,909,631, issued to Kitagawa on Sept. 30, 1975 and assigned to Texas Instruments Incorporated. In operation, one of the memory cells connected to either the node 34 or 36 is selected, and the dummy cell connected to the opposite node is activated by the appropriate one of the dummy cell control lines 41 or 45.

The node 34 is connected to a reference voltage $V_{REF}$ through a transistor 56 and the node 36 is also connected to $V_{REF}$ through a transistor 58. The transistors 56 and 58 have the gates thereof connected to the clock signal $\phi$. The transistors 56 and 58 function to charge the nodes 34 and 36 equally to the voltage level selected to be approximately ($V_{DD} - 2V_T$).

The source of each of the transistors 26 and 28 in each of the sense amplifiers, as described above, is connected to the common node 38. This node 38 is connected to ground through a transistor 60 which has the gate thereof driven by the timing signal $\phi$. The transistor 60 is operable to determine the amount of current drawn from the node 38 to ground. The sensitivity of the sense amplifier is a function of the current drawn through the transistors 26 and 28, as described in detail in U.S. Pat. No. 4,050,061.

As soon as operation is initiated, the flip-flop will tend to go toward a stable condition where either the transistor 26 is conductive and transistor 28 is cut off, or vice versa. The direction of switching depends upon the voltage difference between the nodes 34 and 36, which in turn depends upon whether a logic "1" or a logic "0" was stored in the selected memory cells 42 or 46. Since one of the nodes 34 or 36 will be at a slightly higher voltage than the other, one of the transistors 26 or 28 will have a slightly higher voltage on its gate than the other. Thus, when $\phi$ goes positive, one transistor will tend to conduct slightly more current than the other.

Figure 3:
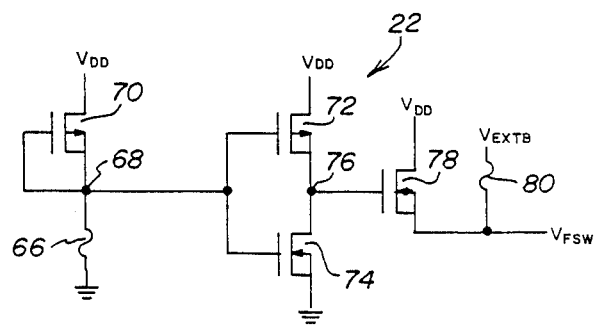
FIG. 3 illustrates a schematic diagram of the fused switch circuit for controlling the memory in FIG. 1.

Referring now to FIG. 3, there is illustrated a schematic diagram of the fused switch 22 which generates the signal $V_{FSW}$ for determining the reference voltage from which the capacitors 50 and 54 are charged. A fuse 66 is connected between a node 68 and ground. A p-channel transistor 70 is connected between $V_{DD}$ and the node 68 with the source thereof shorted to the gate. The node 68 is connected to the gates of a p-channel transistor 72 and an n-channel transistor 74. The n-channel transistor 74 is connected between a node 76 and ground. The p-channel transistor 72 is connected between $V_{DD}$ and the node 76. A p-channel transistor 78 is connected between $V_{DD}$ and the $V_{FSW}$ with the gate thereof connected to the node 76. A fuse 80 is connected between $V_{FSW}$ and the external test point $V_{EXTB}$.

In operation with the fuse 66 intact, the transistor 70 is off and the node 68 is at ground. This turns transistor 72 on and transistor 74 off, pulling node 76 to $V_{DD}$. This in turn turns transistor 78 off, disconnecting $V_{FSW}$ from $V_{DD}$. With fuse 80 intact, the signal $V_{EXTB}$ can be applied to the reference side of the capacitors 50 and 54.

When the fuse 66 and the fuse 80 are opened, transistor 70 pulls node 68 to $V_{DD}$, thus turning transistor 74 on and turning transistor 72 off. This pulls node 76 to ground, turning transistor 78 on and applying $V_{DD}$ to the reference side of the capacitors 50 and 54.

In operation, the voltage signal $V_{FSW}$ is operable to change the maximum value across the capacitors 50 and 54 during testing thereof. One of the important parameters of a Dynamic Random Access Memory (DRAM) is the amount of time that the capacitors in the memory elements can hold a charge. This is relative to the reference voltage $V_{REF}$. This reference voltage provides a trip point for comparison with the charge on the memory cell. Therefore, the memory cell is only required to have a charge slightly higher or lower than the reference voltage. If the voltage is low, the amount of time required for it to discharge is relatively low. If the voltage across the capacitor could be increased, this discharge time is also increased. This is due to the relationship of stored energy to voltage wherein energy is proportional to a square of a voltage. However, it is only desirable to raise the plate voltage of the capacitors 50 and 54 and not the operating voltage of the remainder of the system since this sets a number of parameters such as clock delays, terminal and times of transistors, etc. Therefore, with the fused circuit of FIG. 3, and external voltage can be input to one plate of all of the capacitors and then the capacitors tested. The external voltage $V_{EXTB}$ is input through a test probe on a separate pad. Therefore, it is not necessary to provide an extra external connection to the chip to input the external voltage. After resting, the fuses 66 and 80 can be opened, thus applying $V_{DD}$ to the reference side of the capacitors 50 and 54.

Figure 4:
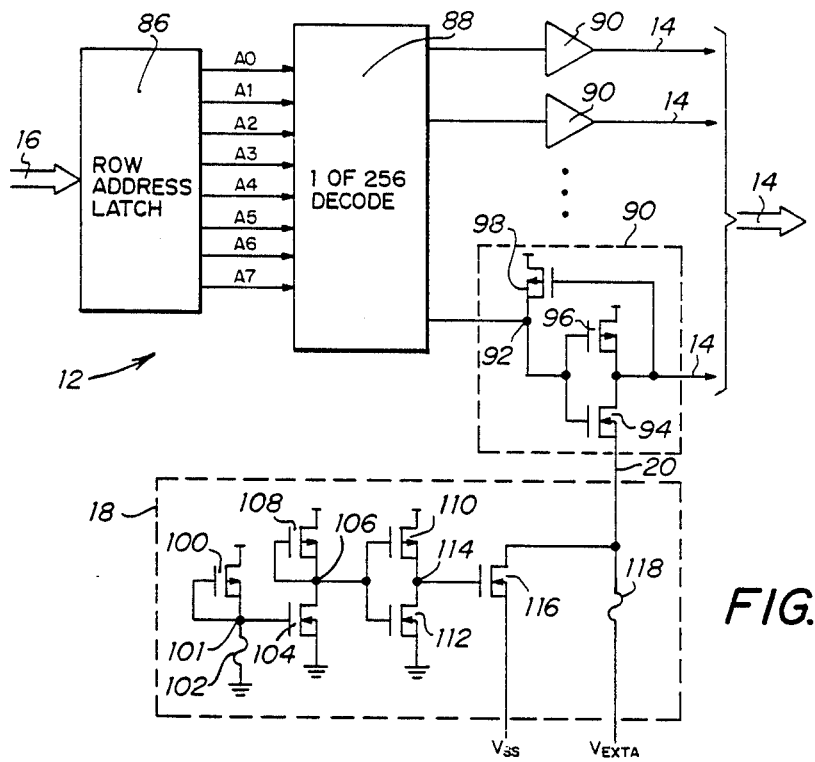
FIG. 4 illustrates a schematic diagram of the reconfigurable row decoder of FIG. 1.

Referring now to FIG. 4, there is illustrated a schematic block diagram of the row decoder 12 and the fused switch 18, wherein like numerals refer to like parts in the various figures. The address is latched in a row address latch 86 to output the latched address A0–A7 into a one of 256 decoder circuit 88. The decoder circuit 88 outputs 256 mutually exclusive outputs, each of which is input to a separate row line in the memory array 10 through a buffer 90. The buffer 90 has the input thereof connected to a node 92 with the node 92 being connected to the gate of an N-channel transistor 94 and a p-channel transistor 96. In addition, the node 92 is connected to the drain of a p-channel transistor 98. The source of the transistor 94 is connected to the control voltage line 20 and the drain thereof is connected to the row line 14. The transistor 96 has the source thereof connected to the row line 14 and the drain thereof connected to $V_{DD}$. Each of the buffers 90 are interconnected with the voltage control line 20 to provide a reference voltage for the respective one of the transistors 94.

The fused switch 18 is comprised of a p-channel transistor 100 having the drain thereof connected to $V_{DD}$ and the gate and source thereof connected to a node 101. The node 101 is connected to ground through a fuse 102 and also to the gate of an n-channel transistor 104, the source of which is connected to ground and drain of which is connected to a node 106. A p-channel transistor 108 has the drain thereof connected to $V_{DD}$ and the gate and source thereof connected to node 106. The node 106 is connected to the gates of a p-channel transistor 110 and an n-channel transistor 112. The p-channel transistor 110 has the source thereof connected to a node 114 and the drain thereof connected to $V_{DD}$. The n-channel transistor 112 has the source thereof connected to ground and the drain thereof connected to the node 114, the node 114 being connected to the gate of an n-channel pass transistor 116. The pass transistor 116 has the source thereof connected to $V_{SS}$ and the drain thereof connected to the control line 20. As described above, ground and $V_{SS}$ are normally the same but, for illustrative purposes, $V_{SS}$ is distinguished as a reference voltage. The external voltage $V_{EXTA}$ is connected to the control line 20 through a fuse 118.

When the fuses 102 and 118 are intact, the voltage $V_{EXTA}$ is applied to the control line 20 to determine the reference voltage that is placed onto the row line 14 when the transistor 94 for one of the respective buffers 90 is turned on. This represents the unselected state for the rows. With the fuse 102 intact, node 101 is held to ground, thus turning off transistor 104 and turning on transistor 108. This keeps node 106 at $V_{DD}$, turning on transistor 112 and turning off transistor 110. This places the pass transistor 116 in the nonconducting state and allows current to be linked at the voltage $V_{EXTA}$ through the fuse 118, allowing the bias voltage for the unselected row lines 14 to be controlled externally. In the selected state, the transistor 94 is turned off and the transistor 96 is turned on to hold the row line 14 at $V_{DD}$, regardless of the state of fuses 102 and 118.

When fuses 102 and 118 are open, transistor 100 holds node 101 to $V_{DD}$ and turns on transistor 104 to pull node 106 to ground, thus turning off transistor 112 and turning on transistor 110. This causes pass transistor 116 to conduct, thus connecting the reference voltage $V_{SS}$ to the control line 20 and allows the circuit to function with normal operating parameters.

Referring to FIG. 2, the voltage on row lines 14 determine whether or not transistors 52 conduct and connect the top plate of capacitors 54 to nodes 34 and 36. Since transistors 52 are n-channel enhancement mode devices, a high voltage ($V_{DD}$) on row line 14 will cause its associated transistors 52 to conduct, and a low voltage ($V_{SS}$) on row line 14 will cause its associated transistors 52 to not conduct. In normal operation, of course, only a single row line 14 will be connected to node 34 or 36, so that the state of only a single capacitor 54 will be sensed by the sense amplifier. If one of capacitors 54 from an unselected one of row lines 14 is coupled the same one of nodes 34 or 36, the charge stored by said capacitor 54 may leak off to said node 34 or 36, causing the data state of said capacitor 54 from an unselected row line 14 to change its data state. The leakage may of course be less than all of the stored charge of capacitor 54 which, while short of changing the data state of the contents of capacitor 54 at the time it is coupled, will mean that less charge will be presented by this memory cell to node 34 or 36 when subsequently sensed, and will also mean that the amount of time which capacitor 54 will hold its data state is decreased. If capacitor 54 is not able to hold its original data state until the next time that it is refreshed, the data state of capacitor 54 will remain in error.

Defects in the manufacture of the memory device such that one or more of transistors 52 are not turned off when the associated row lines 14 are deselected, or an undesired low threshold voltage for transistors 52, may cause leakage from a capacitor 54 in an unselected one of row lines 14 to the node 34 or 36, such that either its stored charge will be lost in whole or in part when another one of row lines 14 is selected. A memory device not utilizing the invention disclosed herein may be tested for such leakage by way of a disturb algorithm which repeatedly accesses one or more of row lines 14 (the "disturb rows") for which the associated capacitors 54 have a data state opposite from the data state of capacitors 54 associated with a neighboring row line 14 (the "test row"). The number of repetitions is generally at least as long as the refresh time specification of the memory device. After the repeated accesses of the disturb row(s), the capacitors 54 of the test row are read to determine if enough charge has leaked through transistors 52 so that the original data state of capacitors 54 has been lost. The opposite data state of capacitors 54 in the disturb rows tends to accentuate the discharge of the capacitors 54 associated with the test row if leakage through transistors 52 is present, by presenting an opposite polarity at node 34 or 36 during the sensing time. It should also be noted that the charge of capacitors 54 may also leak to nodes 34 and 36 during the precharge portion of the memory cycle, as well. However, such disturb algorithms provide only an indirect testing of the presence of the leakage condition, and also require a great deal of test time in order to execute the large number of repeated accesses generally required to cause enough leakage for a change in data state.

The circuit of FIG. 4, with fuses 102 and 118 intact, allows a more accurate test of such leakage to be done in a quicker fashion, compared with a disturb algorithm. As discussed above, the circuit of FIG. 4 allows the voltage of the unselected row lines 14 to be set at any desired level without affecting the reference supply $V_{SS}$ elsewhere in the circuit, such as in the sense amplifier of FIG. 2.

An example of a method for accurately characterizing the leakage through transistors 52 consists of first initializing the memory device by writing data so as to charge the capacitors 54 associated with a first one of row lines 14 (the "test row") to one data state, and of writing the opposite data state to the capacitors 54 associated with another one of row lines 14 (the "disturb row"). After setting these data states, the test is performed by setting the voltage at terminal $V_{EXTA}$ to a desired level, and performing a memory cycle which selects the disturb row. The voltage at terminal $V_{EXTA}$, if higher than $V_{SS}$, will tend to make the transistors 52 associated with the test row to conduct. Subsequent to the cycle which selects the disturb row with the voltage at terminal $V_{EXTA}$ set to the desired level, the contents of the capacitors 54 in the test row are read to determine if sufficient charge leaked from any of the capacitors 54 to change its data state. The value of voltage at terminal $V_{EXTA}$ which causes enough leakage to cause a change of data state may thus be measured by repeating the selection of the disturb row and reading of the test row, while incrementing for each select and read cycle the voltage at terminal $V_{EXTA}$, going in the direction from $V_{SS}$ upward toward $V_{DD}$. Once a value of the voltage at terminal $V_{EXTA}$ is found for a given test row, the test process may be repeated for the remainder of the row lines 14 in the memory device. The results of this procedure for a given memory device may be recorded and compared against other other memory devices, and may also be correlated to the classical disturb test described above, and to a refresh time operating specification.

Of course, the circuit of FIG. 4 also allows the ability to use an external voltage on the unseleced ones of row lines 14 in a manufacturing test, where devices are either considered as passing the desired specificatin or discarded. In this mode, the selection of the disturb row, and susbsequent reading of the test row, may be done with the voltage of terminal $V_{EXTA}$ at a single predetermined level. The characterization routine described above may be useful to determine this desired level. With only the single value of voltage of terminal $V_{EXTA}$ utilized, the test for leakage through transistors 52 may be done much more quickly than the disturb algorithm, which requires repeated selection of the disturb rows, and will produce a more accurate result. Subsequent to the desired test, whether done as device characterization, pass-fail, or both, fuses 102 and 118 may be opened as discussed above, so that the memory device is capable of functioning using $V_{SS}$ as the reference supply for the unselected ones of row lines 14.

Figure 5:
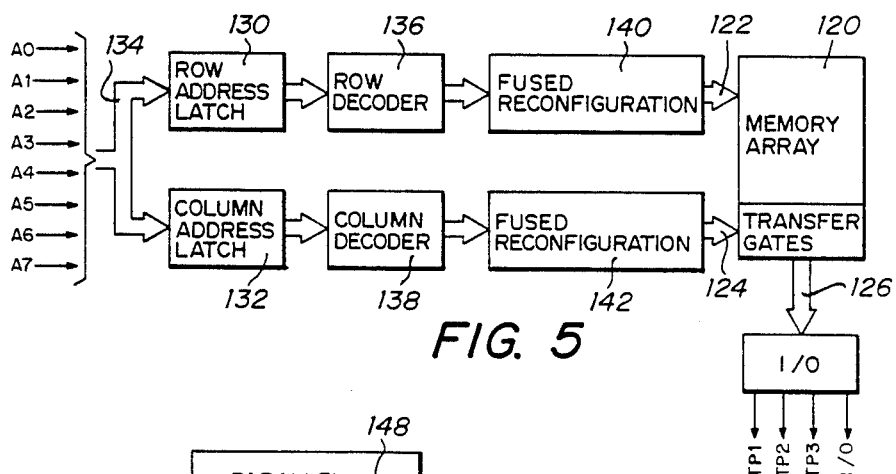
FIG. 5 illustrates an alternate embodiment of the present invention for reconfiguring the output arrangement of a semiconductor memory.

Referring now to FIG. 5, there is illustrated a schematic block diagram of a fuse circuit for reconfiguring the memory array in a semiconductor memory. A memory array 120 is provided which is similar to the memory array 10 of FIG. 1. The memory array 120 has the memory cells therein arranged in rows and columns with the memory cells selected by signals placed onto row lines 122 and the column selected by the signal placed onto column lines 124. The row lines 122 activate the gates of all of the memory cell transistors associated with that particular row line. The output of each of these memory cells is then stored in the associated one of the sense amps (not shown) for connection to the particular column line. To select the information stored in the sense amp, it is necessary to activate one or more transfer gates 126, of which one is associated with each column. The transfer gates 126 are each controlled by one of the column lines 124. For example, if the memory array were a "by one", only one of the column lines 124 would be activated at a time to output information from only one of the memory cells in the selected row. If the memory are "by four", the outputs of four cells in the selected row would be output. In the device illustrated in FIG. 5, only one memory cell can be selected in the normal configuration. This selected memory element is then input to an input/output circuit (I/O) 128 for output on an I/O line. However, it would be desirable during the testing mode to test more than one cell at a time. Therefore, reconfiguration circuitry is disposed on the circuitry in accordance with the present invention to test four cells at a given time. This essentially reconfigures a "by one" memory into a "by four".

An eight bit address A0–A7 is input to a row address latch 130 and a column address latch 132 through an address line 134. The output of the row address latch 130 is input to a row decoder 136 and the output of the column address 132 is input to a column decoder 138. The row decoder 136 and the column decoder 138 both output only one output for each column and row address input thereto. This normally selects only one row and one column. However, the row decoder can be reconfigured by a fuse reconfiguation circuit 140 and the column decoder 138 can have the output thereof reconfigured by a fused reconfiguration circuit 142. Therefore, more than one row can be selected for a given address on the row lines 122 and more than one column can be selected for a given address on column lines 124. The additional outputs are input to the I/O circuit 128 and then output on lines TP1, TP2 and TP3. These are test points on the chip which can be probed during manufacturing tests and they do not require interconnection during normal operation mode. Each of the fuse reconfiguration circuits 140 and 142 are configured to control the row lines or column lines to output information from additional ones of the memory cells in the memory array 120 during the initial test. Internal fuses can then be opened and the circut placed in a normal operating mode.

Figure 6:
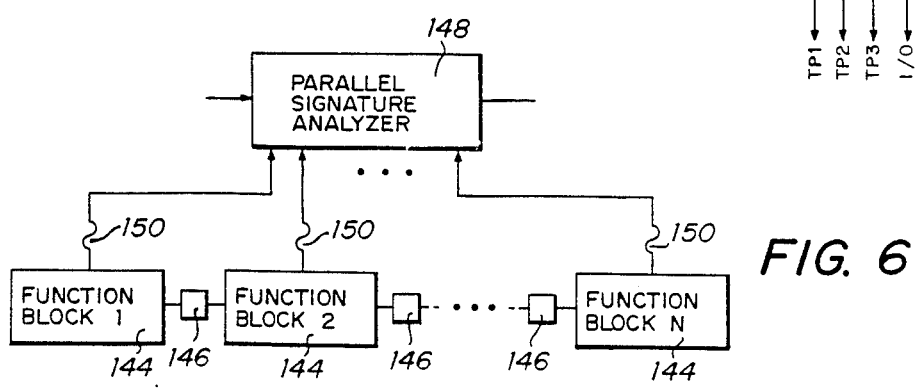
FIG. 6 illustrates an alternate embodiment of the present invention utilizing a parallel signature analyzer.

Referring now to FIG. 6, there is illustrated an alternate embodiment of the present invention wherein the integrated circuit is divided into a plurality of function blocks 144. The function blocks 144 are labeled "1" through "N" and represent the various functions in an integrated circuit such as the memory array. Each of the function blocks is connected to the other function block through a normally open fuse connection 146 such that the function blocks 144 can interact in a cohesive manner. One example, as described above, is a memory array wherein the functions are such things as clock generating circuits, decoder circuits and the various functions utilized in storing information in the memory elements. The output of each of the function blocks is connected to a parallel signature analyzer (PSA) 148 through fuses 150. The PSA 148 receives data from each of the function blocks and analyzes this data in a parallel manner. These techniques are fully discussed in "Analysis and Assimilation of Parallel Signature Analysis", international Test Conference, 1982 Proceedings, T. Sirdhar, D.S. Ho, P.T. Powell, S. M. Thatte, pp. 656–661.

When the test is performed, the result is compared with an expected result to determine if all of the function blocks 144 operate in the expected manner. If not, this device is registered as a defect and further testing performed to determine the nature of the failure. If, however, the result provides the true comparison with the expected result, the fuses 150 are opened and the fuse circuit 146 is activated to interconnect the various function blocks 144 and the circuit operated in its normal mode.

In summary, there has been provided a device for increasing the testability of integrated circuits. Select parameters on an integrated circuit are accessed through configuration circuits which are configured in a first mode to enhance testability by allowing access to select parameters and in a second mode for normal operation. During the first mode, the circuit is tested and then fuses opened or contacts made to place the circuit in the second mode. By allowing access to the select parameters, testing can be more easily facilitated.

Although the preferred embodiment has been described in detail, it should be understood that various changes, substitutions and alternations can be made therein without departing from the spirit and scope of the invention as defined by the appended claims.

I claim:

1. An integrated circuit, comprising:
   a bias node for receiving a voltage from a bias supply;
   a plurality of memory cells, each comprising a capacitor having a first plate connected to said bias node and having a second plate;
   sensing means for sensing the contents of a memory cell;
   means for addressing one of said memory cells responsive to an address signal, said addressing means connecting the second plate of the addressed memory cell to said sensing means;
   means for isolating said bais node from said external bias supply, so that said bias supply may be applied to other portions of said integrated circuit while not being applied to said bias node;
   a test voltage terminal for receiving a test voltage, said test voltage terminal connected to said bias node so that the operation of said circuit with a voltage at said first plate of said memory cell capacitors different from the voltage of said bias supply may be tested;
   means for disconnecting said test voltage terminal from said bias node; and
   means for disabling said isolating means, so that said first plates of said memory cell capacitors may be biased by said bias supply in the operation of said integrated circuit when said isolating means is disabled.

2. The integrated circuit of claim 1, wherein said disconnecting means comprises a first fuse connected between said test voltage terminal and said bias node, said circuit being manufactured with said first fuse in its conductive state.

3. The integrated circuit of claim 2, wherein said disabling means comprises a second fuse connected between said isolating means and a second bias node, said circuit being manufactured with said second fuse in its conductive state;
   and wherein said isolating means is responsive to the voltage at said second bias node so that, responsive to said second fuse being in its conductive state, said bias node is isolated from said bias terminal.

* * * * *